(12) United States Patent
Feistel

(10) Patent No.: US 11,087,031 B2
(45) Date of Patent: Aug. 10, 2021

(54) METHOD FOR DETERMINING A CONFIGURATION FOR A LOUDSPEAKER ARRANGEMENT FOR RADIATING SOUND INTO A SPACE AND COMPUTER PROGRAM PRODUCT

(71) Applicant: SDA Software Design Ahnert GmbH, Berlin (DE)

(72) Inventor: Stefan Feistel, Berlin (DE)

(73) Assignee: SDA SOFTWARE DESIGN AHNERT GMBH, Berlin (DE)

( * ) Notice: Subject to any disclaimer, the term of this patent is extended or adjusted under 35 U.S.C. 154(b) by 255 days.

(21) Appl. No.: 14/773,720

(22) PCT Filed: Mar. 4, 2014

(86) PCT No.: PCT/DE2014/100077
§ 371 (c)(1),
(2) Date: Sep. 8, 2015

(87) PCT Pub. No.: WO2014/135155
PCT Pub. Date: Sep. 12, 2014

(65) Prior Publication Data
US 2016/0026737 A1 Jan. 28, 2016

(30) Foreign Application Priority Data
Mar. 8, 2013 (DE) .................... 10 2013 102 356.8

(51) Int. Cl.
*G06F 30/00* (2020.01)
*G06F 17/10* (2006.01)
(Continued)

(52) U.S. Cl.
CPC .............. *G06F 30/00* (2020.01); *G06F 17/10* (2013.01); *H04R 5/02* (2013.01); *H04R 27/00* (2013.01);
(Continued)

(58) Field of Classification Search
None
See application file for complete search history.

(56) References Cited

U.S. PATENT DOCUMENTS

2005/0031143 A1* 2/2005 Devantier ................ H04R 5/02
381/300
2007/0150284 A1* 6/2007 Monks .................... H04S 7/301
704/270

(Continued)

OTHER PUBLICATIONS

Feistel, Stefan, Mario Sempf, Kilian Köhler, and Holger Schmalle. "Adapting loudspeaker array radiation to the venue using numerical optimization of FIR filters." In Audio Engineering Society Convention 135. Audio Engineering Society, 2013. 10 pages (Year: 2013).*

(Continued)

*Primary Examiner* — Omar F Fernandez Rivas
*Assistant Examiner* — Robert S Brock
(74) *Attorney, Agent, or Firm* — Eversheds Sutherland (US) LLP

(57) ABSTRACT

The invention relates to a method for determining a configuration for a loudspeaker arrangement for radiating sound into a space, wherein the method comprises the following steps: providing an initial configuration having initial configuration parameters for a loudspeaker arrangement for radiating sound into a space in the computer, determining configurations having respectively associated configuration parameters by means of a target function-based optimisation method, wherein, proceeding from the initial configuration, in the computer a sound field for the space and/or parts thereof into which sound is to be radiated is determined iteratively to a candidate configuration by means of simulation, a value of a target function associated with the candidate configuration and the simulated sound field is determined and a new candidate configuration for the loudspeaker arrangement is selected, and selecting a configura- (Continued)

Figure 1:
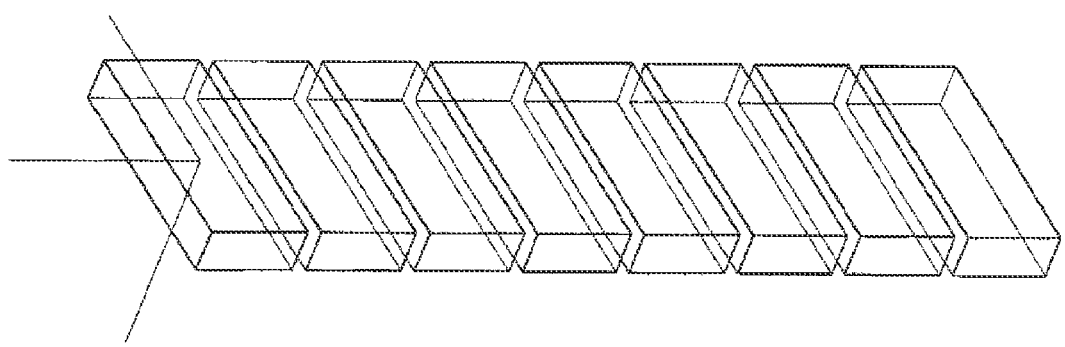

tion having configuration parameters from the iteratively determined candidate configurations in accordance with at least one selection criterion, which takes into consideration at least the values determined for the target function, wherein a target function is used in the optimisation method. The invention further relates to a computer program product.

18 Claims, 14 Drawing Sheets

(51) Int. Cl.
    *H04R 5/02*     (2006.01)
    *H04S 7/00*     (2006.01)
    *H04R 27/00*     (2006.01)
(52) U.S. Cl.
    CPC ........ *H04S 7/301* (2013.01); *H04R 2205/024* (2013.01)

(56) References Cited

U.S. PATENT DOCUMENTS

| | | | | |
|---|---|---|---|---|
| 2007/0269062 | A1* | 11/2007 | Rodigast | H04R 1/403 381/310 |
| 2008/0049948 | A1* | 2/2008 | Christoph | H04S 7/301 381/86 |
| 2009/0304211 | A1* | 12/2009 | Tashev | H04R 3/12 381/182 |
| 2010/0232635 | A1* | 9/2010 | Miyazaki | H04S 7/301 381/336 |
| 2010/0246839 | A1* | 9/2010 | Thompson | H04R 1/403 381/59 |
| 2010/0305725 | A1* | 12/2010 | Brannmark | H04S 7/301 700/94 |
| 2013/0114830 | A1* | 5/2013 | Eastty | H04S 7/301 381/98 |
| 2013/0163766 | A1* | 6/2013 | Choueiri | H04R 3/04 381/17 |
| 2014/0119570 | A1* | 5/2014 | Davis | H04R 3/12 381/103 |
| 2018/0027350 | A1* | 1/2018 | Buerger | H04S 7/302 |

OTHER PUBLICATIONS

Feistel, Stefan, Wolfgang Ahnert, Charles Hughes, and Bruce Olson. "Simulating the directivity behavior of loudspeakers with crossover filters." In Audio Engineering Society Convention 123. Audio Engineering Society, 2007. 19 pages (Year: 2007).*
Greenfield, Richard, and Malcolm J. Hawksford. "Efficient filter design for loudspeaker equalization." Journal of the Audio Engineering Society 39, No. 10 (1991): 739-751 (Year: 1991).*
Potchinkov, Alexander. "Frequency-Domain Equalization of Audio Systems Using Digital Filters, Part 1: Basics of Filter Design." Journal of the Audio Engineering Society 46, No. 11 (1998): 977-987 (Year: 1998).*
Potchinkov, Alexander. "Frequency-Domain Equalization of Audio Systems Using Digital Filters, Part 2: Examples of Equalization." Journal of the Audio Engineering Society 46, No. 12 (1998): 1092-1108 (Year: 1998).*
Thompson, Ambrose. "Improved methods for controlling touring loudspeaker arrays." In Audio Engineering Society Convention 127. Audio Engineering Society, 2009. 13 pages (Year: 2009).*
Zhang, Wancheng. "Robust equalization of multichannel acoustic systems." (2010). PhD Thesis, Imperial College London, 142 pages (Year: 2010).*
Heusdens, Richard, Jesper Jensen, W. Bastiaan Kleijn, Valery Kot, Omar A. Niamut, Steven Van De Par, and Micholle H. Van Schijndel. "Bit-rate scalable intraframe sinusoidal audio coding based on rate-distortion optimization." Journal of the Audio Engineering Society 54, No. 3 (2006): 167-188 (Year: 2006).*
Rafaely, Boaz, and Stephen J. Elliot. "A computationally efficient frequency-domain LMS algorithm with constraints on the adaptive filter." IEEE Transactions on Signal Processing 48, No. 6 (2000): 1649-1655 (Year: 2000).*
Michael Saunders, MS&E 318 (CME 338) Large-Scale Numerical Optimization Notes 9: Augmented Lagrangian Methods, Stanford University, Management Science & Engineering (and ICME), 6 pages, 2015; obtained from https://web.stanford.edu/class/msande318/notes/notes09-BCL.pdf on Mar. 4, 2021 (Year: 2015).*
Wang, Wenwu, Saeid Sanei, and Jonathon A. Chambers. "Penalty function-based joint diagonalization approach for convolutive blind separation of nonstationary sources." IEEE Transactions on Signal Processing 53, No. 5 (2005): 1654-1669 (Year: 2005).*

* cited by examiner

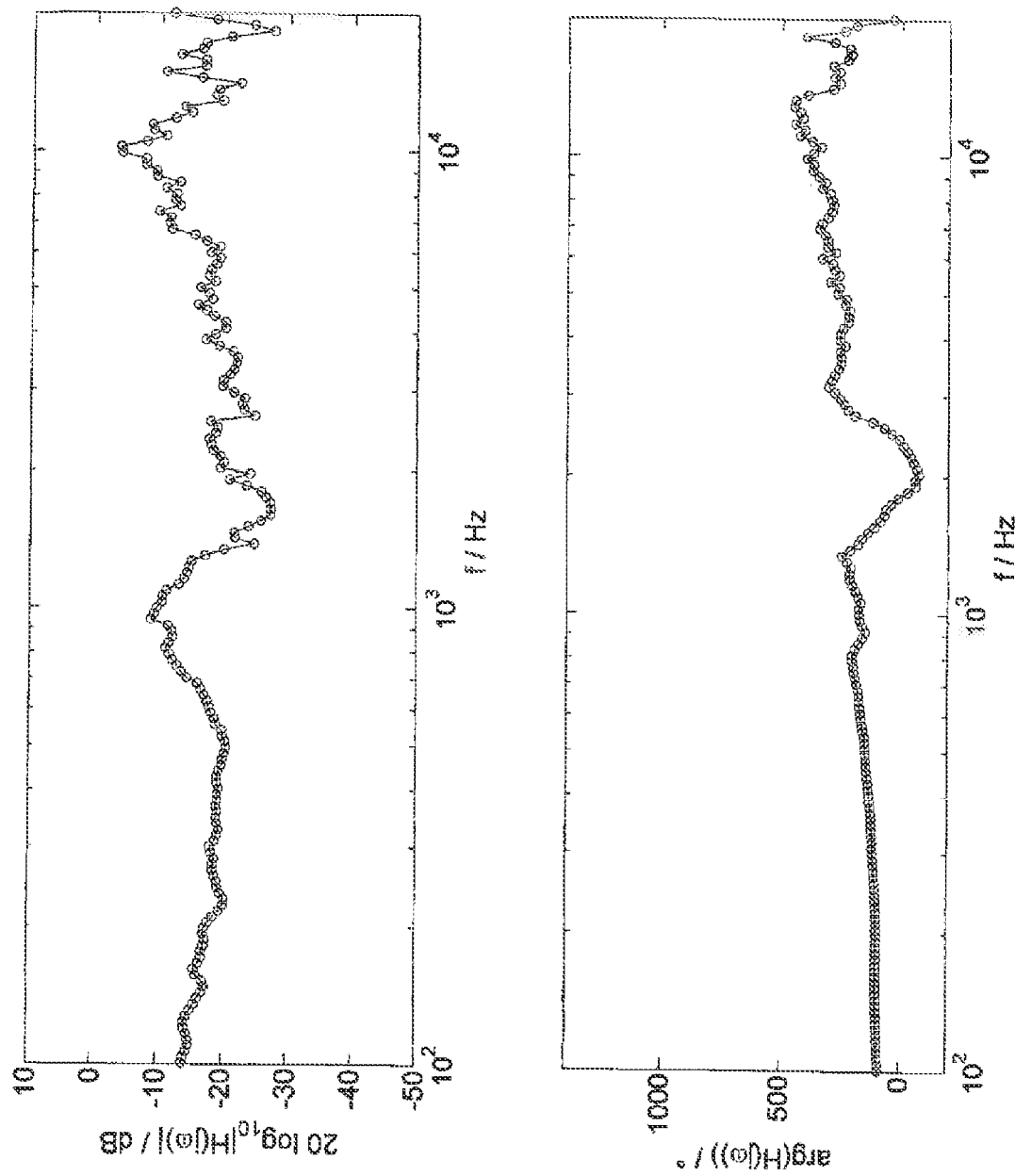

METHOD FOR DETERMINING A CONFIGURATION FOR A LOUDSPEAKER ARRANGEMENT FOR RADIATING SOUND INTO A SPACE AND COMPUTER PROGRAM PRODUCT

The invention relates to a method for determining a configuration for a loudspeaker arrangement for radiating sound into a space and a computer program product.

CROSS-REFERENCE TO RELATED APPLICATIONS

This application claims priority to and benefit of PCT Application No. PCT/DE2014/100077 filed Mar. 5, 2014, which claims priority to German Application No. 10 2013 102 356.8 which is incorporated herein by reference in its entirety.

BACKGROUND

The reproduction or amplification of acoustic signals is effected using loudspeaker technology and sound reinforcement systems. An essential objective of the conception and configuration of these systems consists in achieving an optimal acoustic experience for the listeners/the areas to be covered. The quality of the received sound is described on the one hand by a sound transmission which is as uniform as possible and, on the other hand, by a transmission amplitude/transmission amplification which is as high as possible. Furthermore, room-acoustic criteria may be important, for example the increase of the proportion of early reflections and/or the avoidance of harmful late reflections or echoes.

Accordingly, the loudspeaker system must be chosen and configured in such a way that the requirements regarding transmission quality are achieved. Due to the great variety of options on how to configure the sound system, and due to the geometric complexity of the areas to be covered, there is, however, as a rule, no simple, obvious solution to this problem in practice. Therefore when planning such sound systems, an iterative approach is applied as a rule, i.e. different configuration variants with regard to the different models, positions, orientations, and/or settings of the loudspeakers and the resulting expected acoustic results are developed in succession and compared with each other. Modern simulation software for sound systems enables professional consulting offices to calculate such acoustic results in a quick and comparatively accurate manner, partly even by using an automated iterative process. These aspects are summarised, for example, in Martin Audio, The Edge, Issue Eleven, April 2005, (http://www.martin-audio.com/edge/pdfs/MartinAudio_TheEdge_11.pdf) and illustrated by way of a concrete example.

In order to be able to use automated iteration of configuration variants, it is necessary to specify an unequivocal evaluation criterion for good sound quality, with regard to the case in question. This criterion defines for each configuration variant, whether the variant should be preferred over another variant, or whether it is inferior to it. In numerics and in optimisation theory this is called "objective function", ref., for example, S. Boyd, L. Vandenberghe, Convex Optimization, Cambridge University Press ($7^{th}$ ed. 2009), http://www.stanford.edu/~boyd/cvxbook/bv_cvxbook.pdf. The objective of optimisation then normally consists in minimizing the value of the objective function by means of computing it for various configuration variants. The configuration with the smallest value for the objective function then normally corresponds to the optimal configuration, as measured by the defined evaluation criterion.

Frequently the number of configuration variants is very large or even infinitely large. In such cases evaluation is limited to a subset of all possible variants, and possibly only a result is found which is not optimal with respect to all possible configurations. The problem, how to cover as many configuration variants as possible, given an objective function, and how to get as close as possible to the optimal result, is a core issue of classical optimisation theory.

In the art (see Martin Audio, The Edge, Issue Eleven, April 2005) the typical evaluation criteria cited are the uniform distribution of sound pressure across listening areas and frequency. Possible configuration variants arise from the placement and orientation of the loudspeaker system in relation to the receiving areas. The possibility of changing the settings, such as the filter settings of the control unit of the loudspeaker arrangement and the amplifier, is also hinted at. In this case the automated configuration process then iterates through a number of different loudspeaker positions and angles, in order to determine the uniformity of the sound pressure for each configuration variant and then to propose one or more configuration variants which achieve the highest degree of uniformity.

The document WO 2008/047089 A2 discloses an iterative method of the kind mentioned above for a computer-based determination of a configuration for a loudspeaker arrangement for radiating sound into a venue. Several candidate configurations, for which the associated sound field is then calculated on the basis of a sound radiation model in conjunction with the venue to be covered, are iteratively examined in the known manner. A value is determined for an objective function determined by the sound field, and this value shall then be minimised in terms of the iterative process.

SUMMARY

It is the requirement of the invention to propose a method for determining a configuration for a loudspeaker arrangement for radiating sound into an open or closed space as well as a computer program product, with which the automated configuring of loudspeaker arrangements is improved for an improved acoustic radiation into the space to be covered.

A method for determining a configuration for a loudspeaker arrangement for radiating sound into a space according to independent claim 1 and a computer program product according to claim 12 are proposed. Advantageous developments are the subject of dependent sub-claims.

A method for determining a configuration for a loudspeaker arrangement for radiating sound into a space such as a venue is provided. The configuration of the loudspeaker arrangement comprises configuration parameters with which the loudspeaker arrangement is configured for radiating sound into the space actually concerned. With this method an initial configuration with initial configuration parameters for the loudspeaker arrangement is provided in a computer which may be optionally linked to a computer network structure. This is, for example, accomplished by means of transferring electronic information regarding the initial configuration to a computer with which optimisation is to be carried out. Provision may also be made for the initial configuration, which forms the basis for a subsequent optimisation procedure, to be provided in the computer via received user inputs and/or experimental measurement data.

Next, provision is made for determining configurations with respectively associated configuration parameters with the aid of an objective-function-based optimisation procedure. Various embodiments of such optimisation procedures are known as such, and are normally used for optimisation of an initial configuration with the aid of numerical methods. An objective function may be used in order to evaluate the result of individual optimisation steps. The optimisation procedure is used, starting with the initial configuration, to iteratively execute the following steps in the computer. For a candidate configuration a sound field is determined by means of simulation for the space and/or parts thereof to be covered. The simulation is based on a model for the sound radiation of the loudspeaker arrangement into the space to be covered. Such radiation models are known as such in various forms. The sound field determined in this way is associated with the currently examined candidate configuration for the loudspeaker arrangement because the step of simulation is carried out taking into account the candidate configuration parameters. Next, a value of an objective function is determined, which is associated with the candidate configuration and the simulated sound field. With the iterative process a new candidate configuration for the loudspeaker arrangement is then selected and the steps for sound field simulation and for determining the value of the objective function are repeated.

Based on the generated candidate configurations a configuration with configuration parameters for the loudspeaker arrangement is then selected in dependence of at least one selection criterion. The selection criterion takes into account at least the determined objective function values of the candidate configurations. For example, provision may be made to select a candidate configuration, which has the lowest objective function value.

With the iterative optimisation procedure an objective function with several function-determining parameters is used, which apart from one or more sound-field-dependent function terms comprises at least one sound-field-independent function term. Whilst the sound-field-dependent function terms are dependent on the simulated sound field, wherefore they may also be called acoustic function terms, the sound-field-independent function terms are precisely not dependent on the simulated sound field, and are not, insofar, acoustic function terms. The sound-field-independent function terms are however dependent on one or more of the configuration parameters comprised in the configuration. The sound-field-independent function terms are decoupled from the sound field determined by simulation. The sound-field-dependent function terms incorporate properties of the simulated sound field, whereas the sound-field-independent function terms are free from those properties.

The objective function may include one or more sound-field-independent function terms.

The objective function may comprise several function parts which relate to various properties of the simulated sound field, such as a sound level in different areas of the space to be covered. The function parts are used to evaluate properties or optimisation criteria for the several candidate configurations. This makes it possible to compare the candidate configurations and the resulting simulated sound fields for the space to be covered. The several function parts are in turn dependent on one or more sound-field-dependent function terms and/or on one or more sound-field-independent function terms. The objective function parts may be set into relation with each other via arbitrary logical links, thereby forming an overall objective function, for which ultimately a value is determined, which is used for a comparison of the candidate configurations.

The loudspeaker arrangement may be a line array of loudspeaker elements. Other forms of arrangement are of course possible, such as a curved line arrangement, a planar arrangement and/or a spatial arrangement of loudspeaker elements.

One further development provides for the sound-field-independent function term and/or another sound-field-independent function term to be dependent on at least one filter parameter for a filter in a control facility for controlling the loudspeaker arrangement. A dependence on an amplification factor and/or upon a delay time is possible. Also the objective function may be dependent upon more than two sound-field-independent function terms. Various embodiments of filter devices for loudspeaker elements or loudspeaker arrangements are known as such.

Provision may be made with one design for the sound-field-independent function term and/or the other sound-field-independent function term to be dependent on the smoothness of the frequency response of one or more filters in the control facility for controlling the loudspeaker arrangement. Here too, there may exist a dependence on more than two sound-field-independent function terms.

One embodiment provides for the sound-field-independent function term and/or the other sound-field-independent function term to be dependent on a spatial position of one or more loudspeaker elements of the loudspeaker arrangement.

Preferably a further development provides for the sound-field-independent function term and/or the other sound-field-independent function term to be dependent on a spatial direction of one or more loudspeaker elements of the loudspeaker arrangement.

The function terms described in the above paragraphs, which may be included individually or in arbitrary combinations in the objective function, are exemplary function terms which are independent of the simulated sound field, i.e. are not influenced by it. Whilst with the known processes the objective function only includes function terms which in themselves are depending on the acoustics, i.e. the simulated sound field, provision is made here to also include function terms not dependent thereon, i.e. non-acoustic function terms, in the objective function and thus in the calculation of the value of the objective function. Surprisingly it has become evident that the inclusion of such function terms permits an improvement in the automatic configuration of the loudspeaker arrangement regarding the acoustic properties of the arrangement (sound radiation).

In one design provision may be made for the objective function to comprise several function parts, wherein at least one of the several function parts is dependent only on the sound-field-independent function term and/or the other sound-field-independent function term. The objective function may comprise one or more function parts, which depend exclusively on one or more sound-field-independent function terms. Additionally or alternatively the objective function may comprise one or more function parts, which depend on one or more sound-field-dependent function terms as well as one or more sound-field-independent function terms.

Provision may be made for the objective function to comprise a function part, with which, for a given candidate configuration for the loudspeaker arrangement, a deviation of the sound level from a required value in a partial area of the space is evaluated. The lower the value determined for the function part when optimising the objective function, the closer the sound level is to the required value in the concerned partial area of the space.

In one design, provision may be made for the objective function to comprise a function part with which, for a given candidate configuration for the loudspeaker arrangement and independent of an overall volume, the magnitude of the sound level is evaluated in a partial area of the space. The lower the value of the function part when optimising the objective function, the higher is the sound level in the concerned partial area of the space.

One embodiment provides for the objective function to comprise a function part, with which, for a given candidate configuration for the loudspeaker arrangement and independent of an overall volume, a minimisation of the sound radiation is evaluated in another partial area of the space. The lower the value of the function part when optimising the objective function, the smaller is the sound radiation into the other partial area of the space. Optimisation (minimisation) may decrease the sound radiation to the extent, where the sound level in the other partial area of the space drops so far that it lies below a detection threshold (avoidance of sound radiation).

Provision may be made for the objective function to comprise a function part, with which the uniformity of an electric load distribution on at least a part of the loudspeaker elements of the loudspeaker arrangement is evaluated, and which depends on only one or more sound-field-independent function terms.

With one design provision may be made, starting with the selected configuration, for control data to be generated for the control facility for controlling the loudspeaker arrangement and for this data to be provided at an interface in the computer.

DESCRIPTION OF EMBODIMENTS

Figure 2:
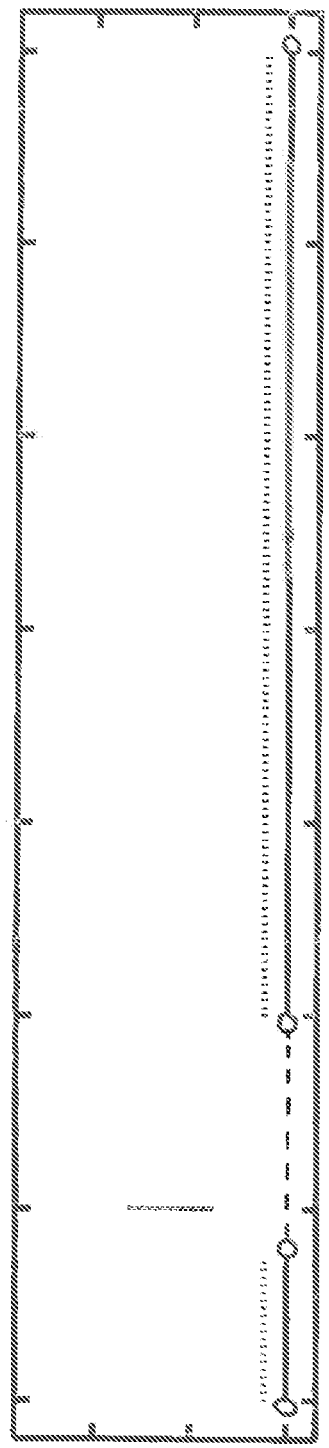
Figure 3:
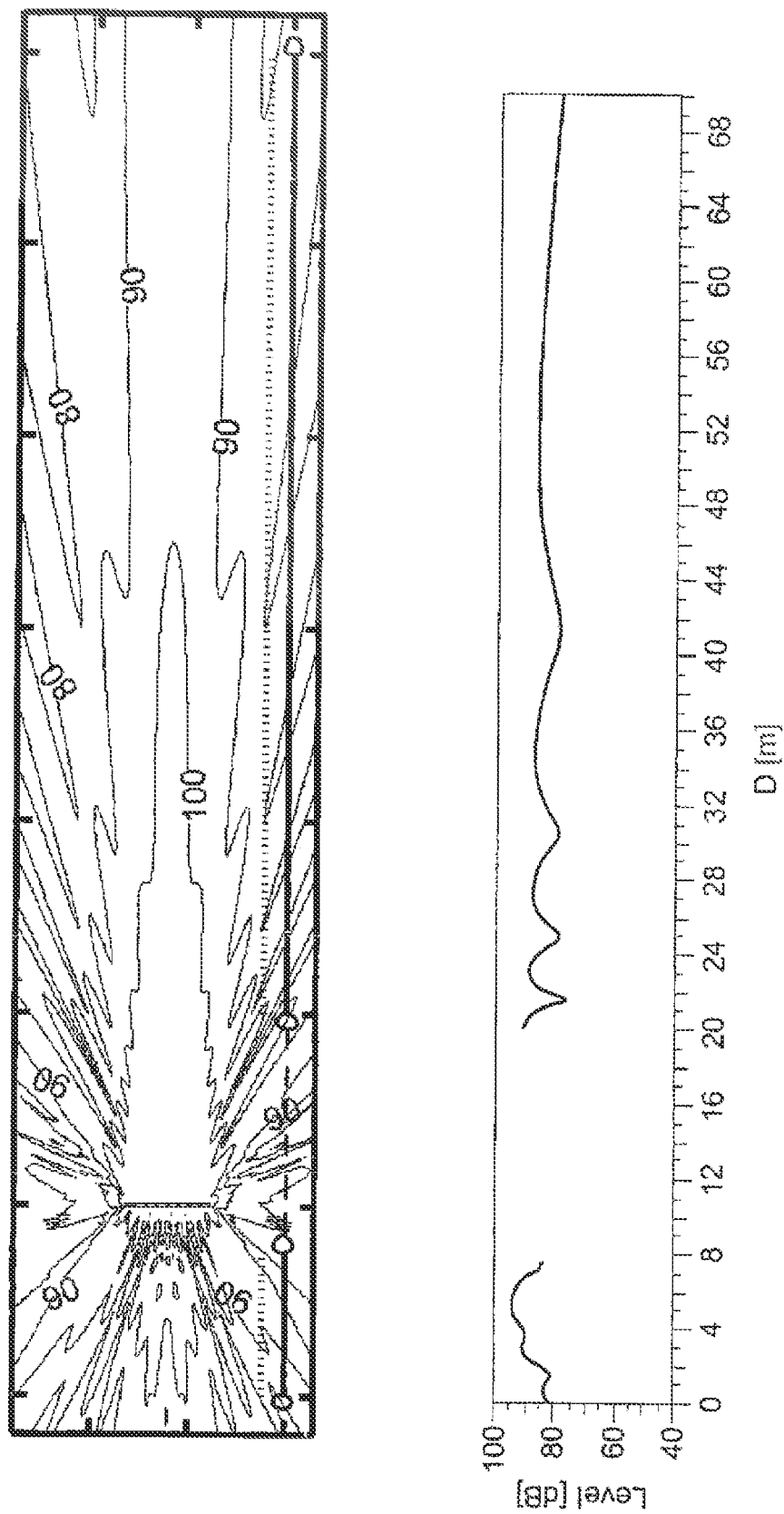
Figure 4:
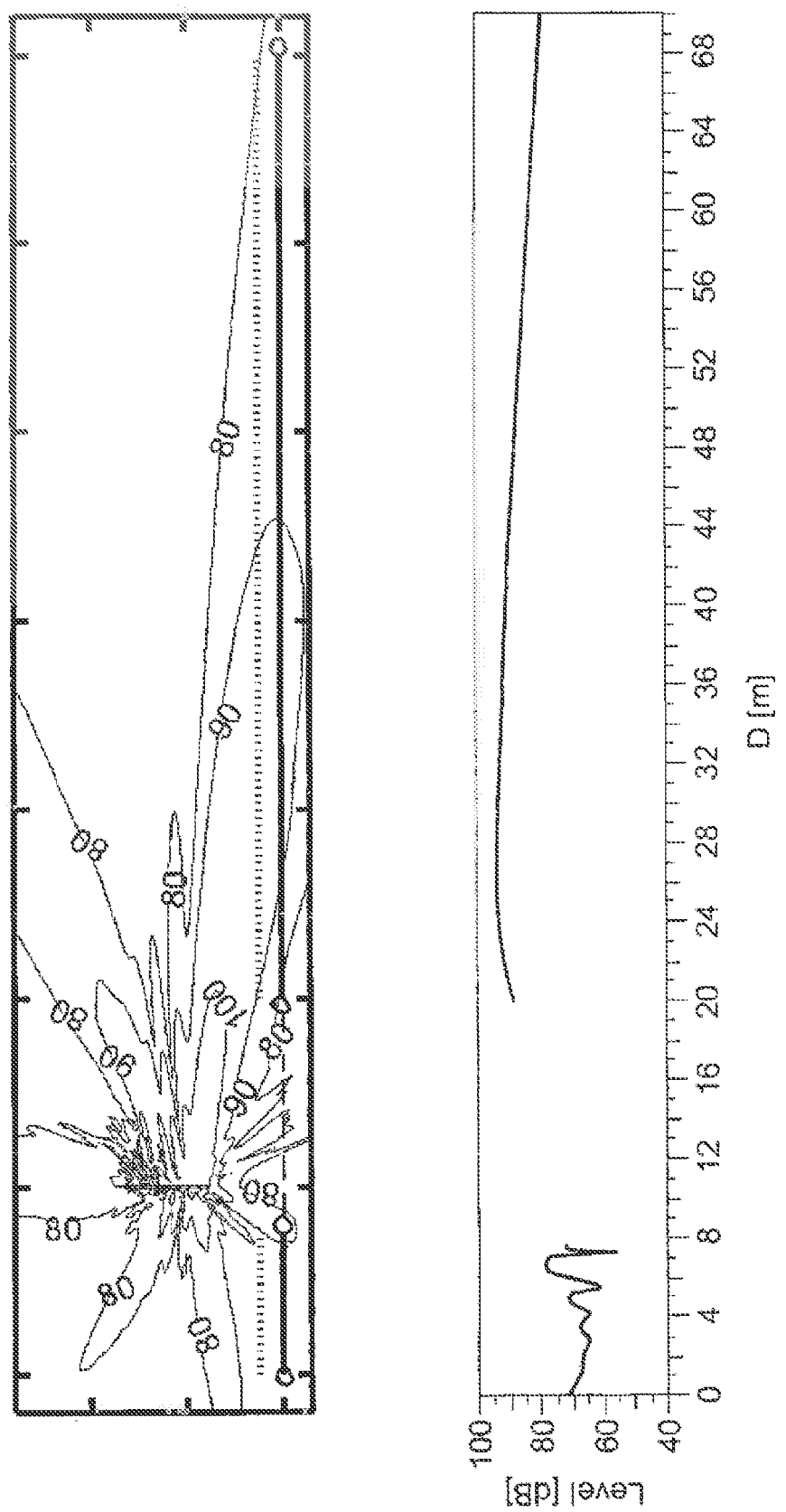
Figure 5:
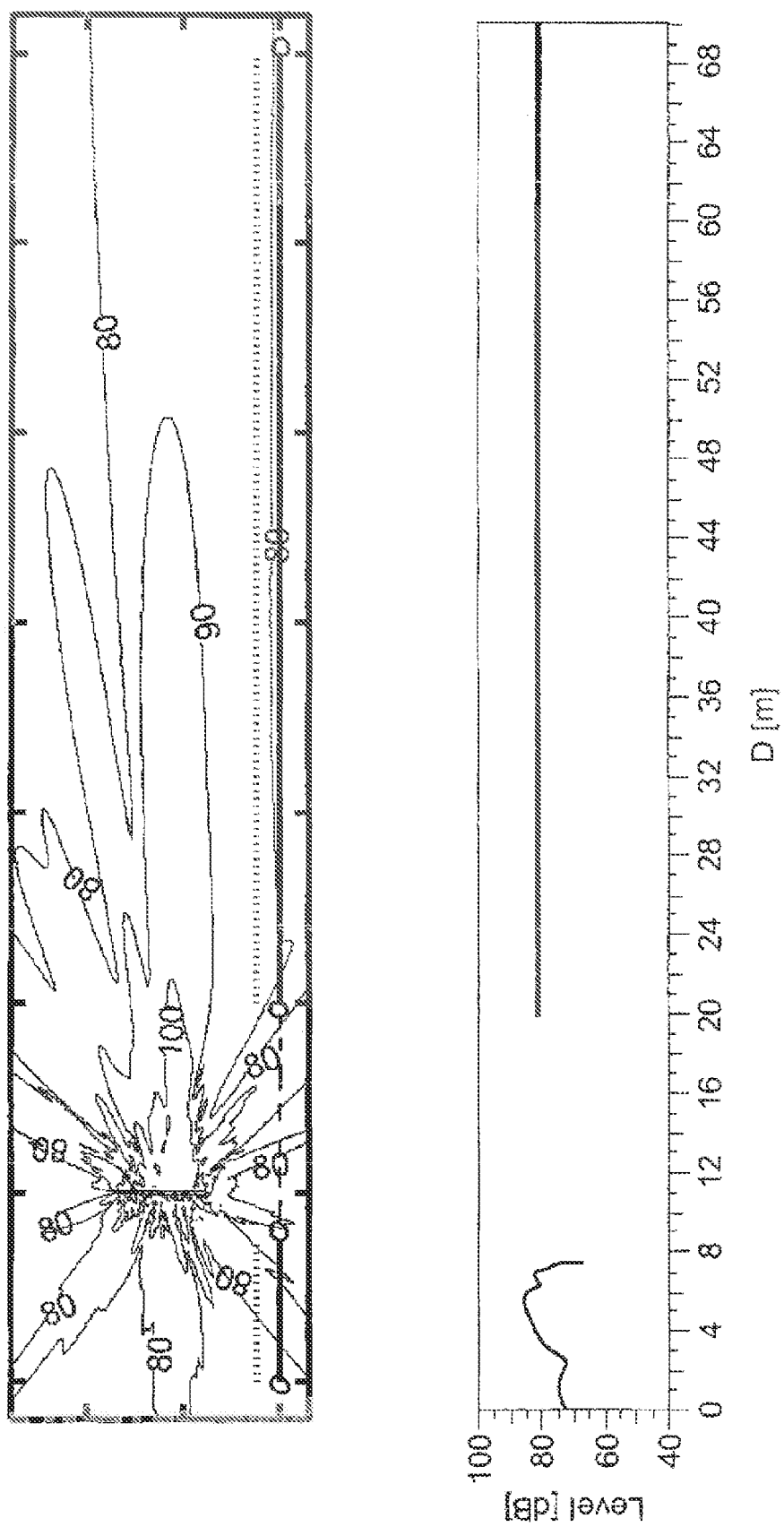
Figure 6:
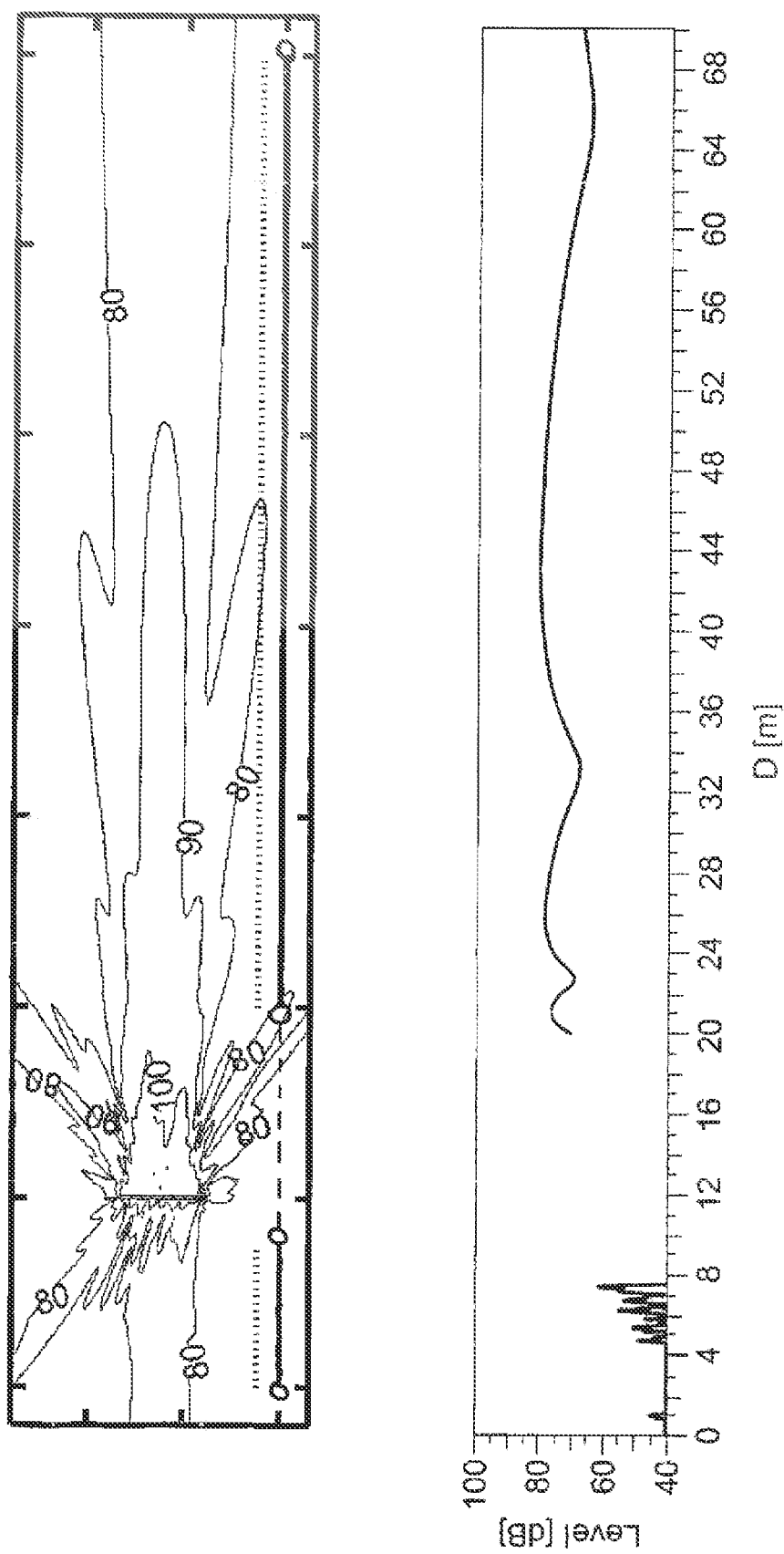
Figure 7:
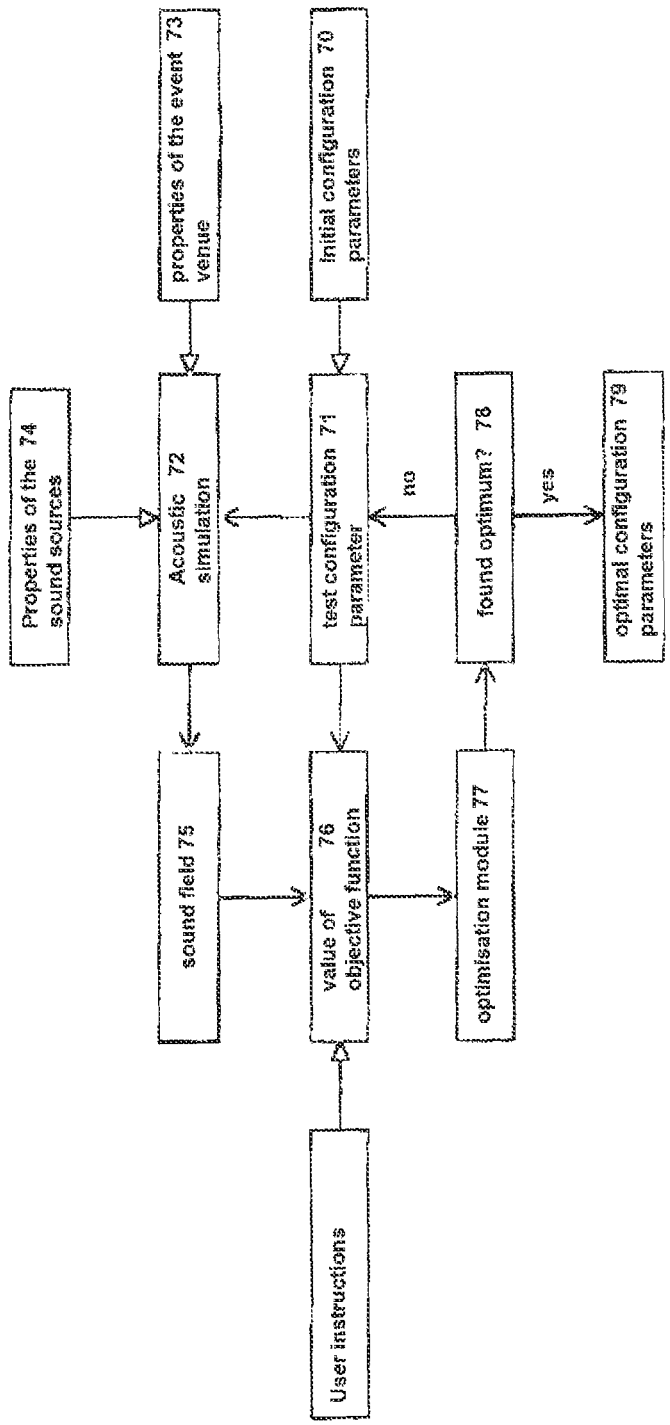
Figure 8:
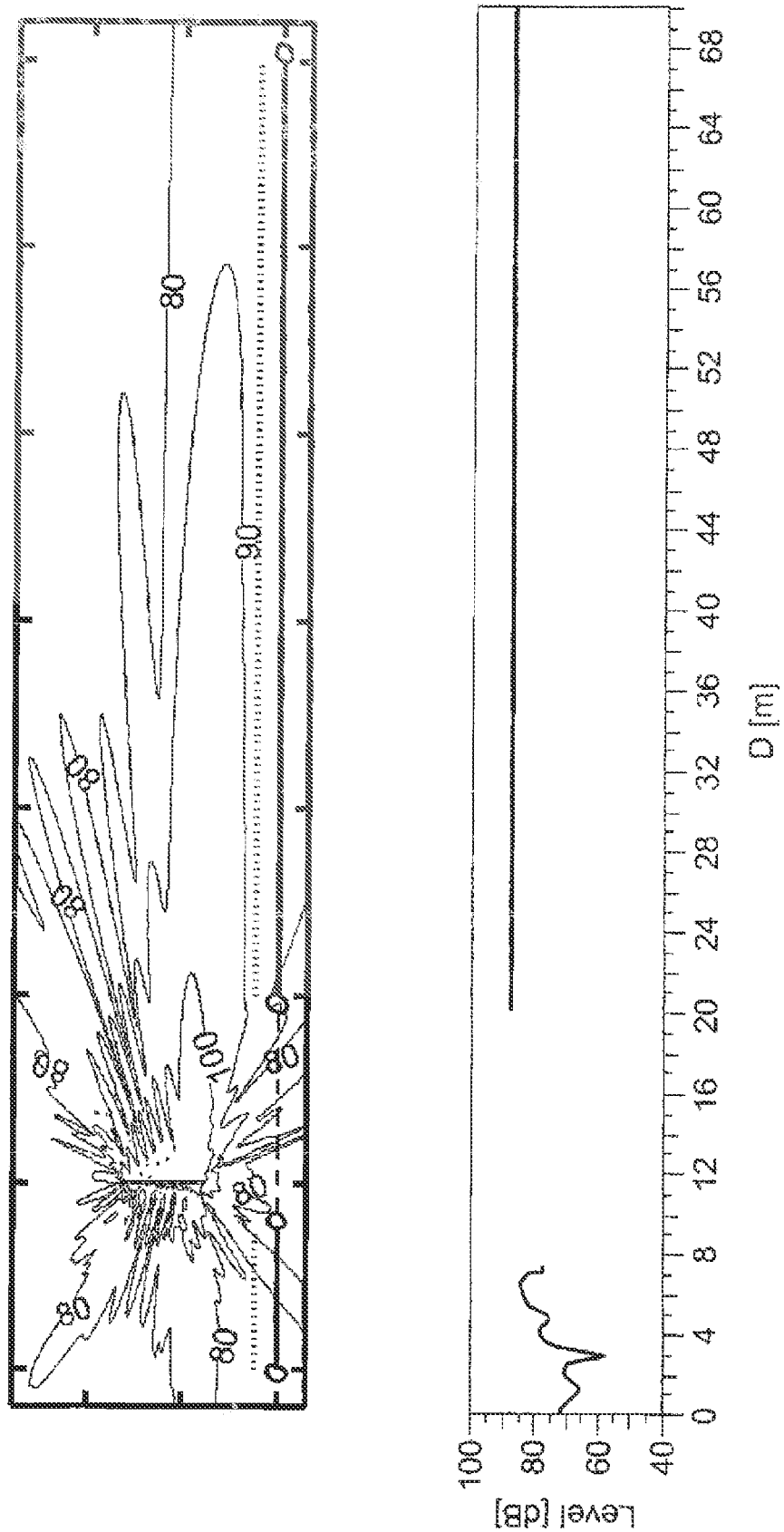
Figure 9:
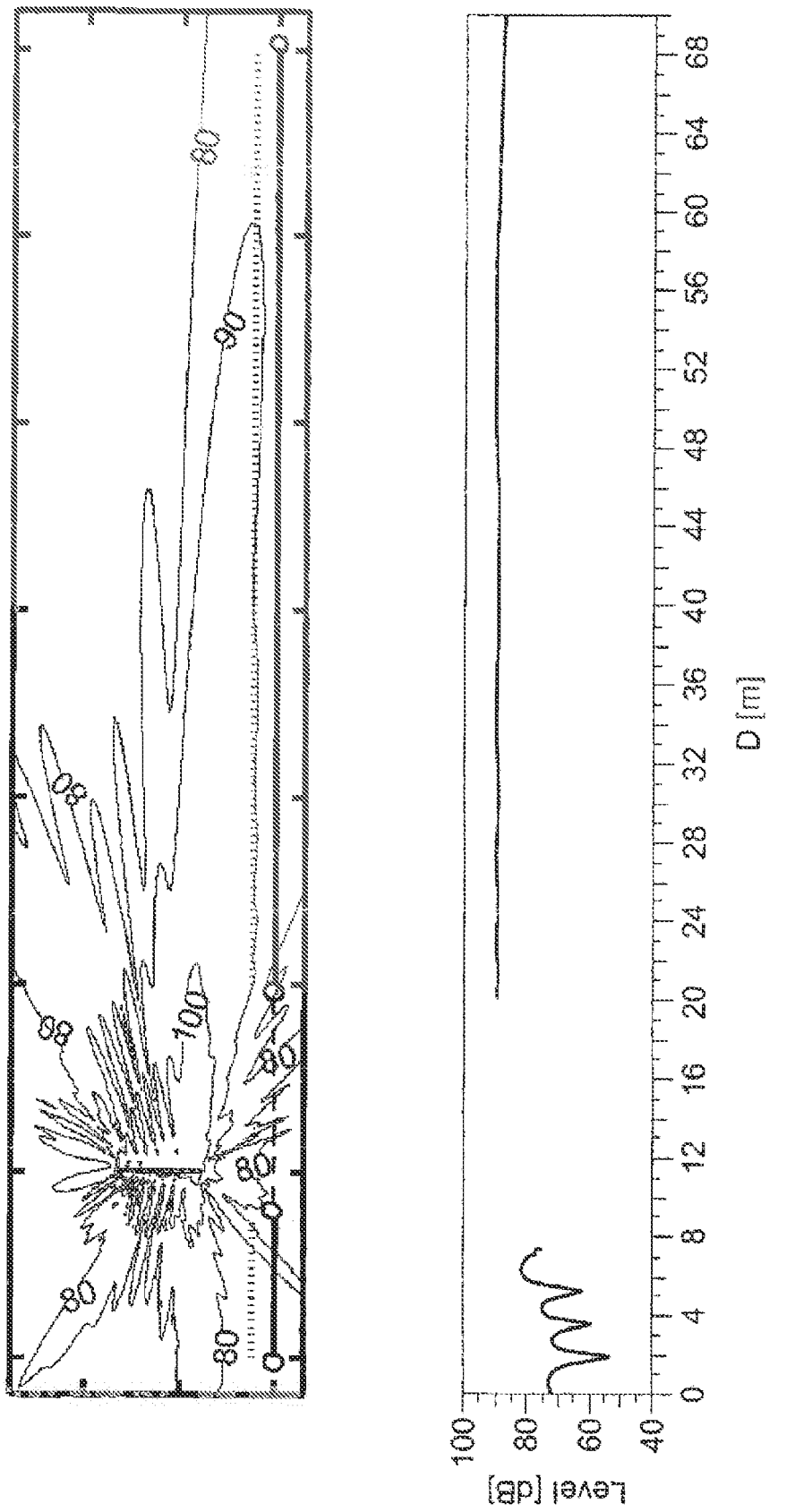
Figure 10:
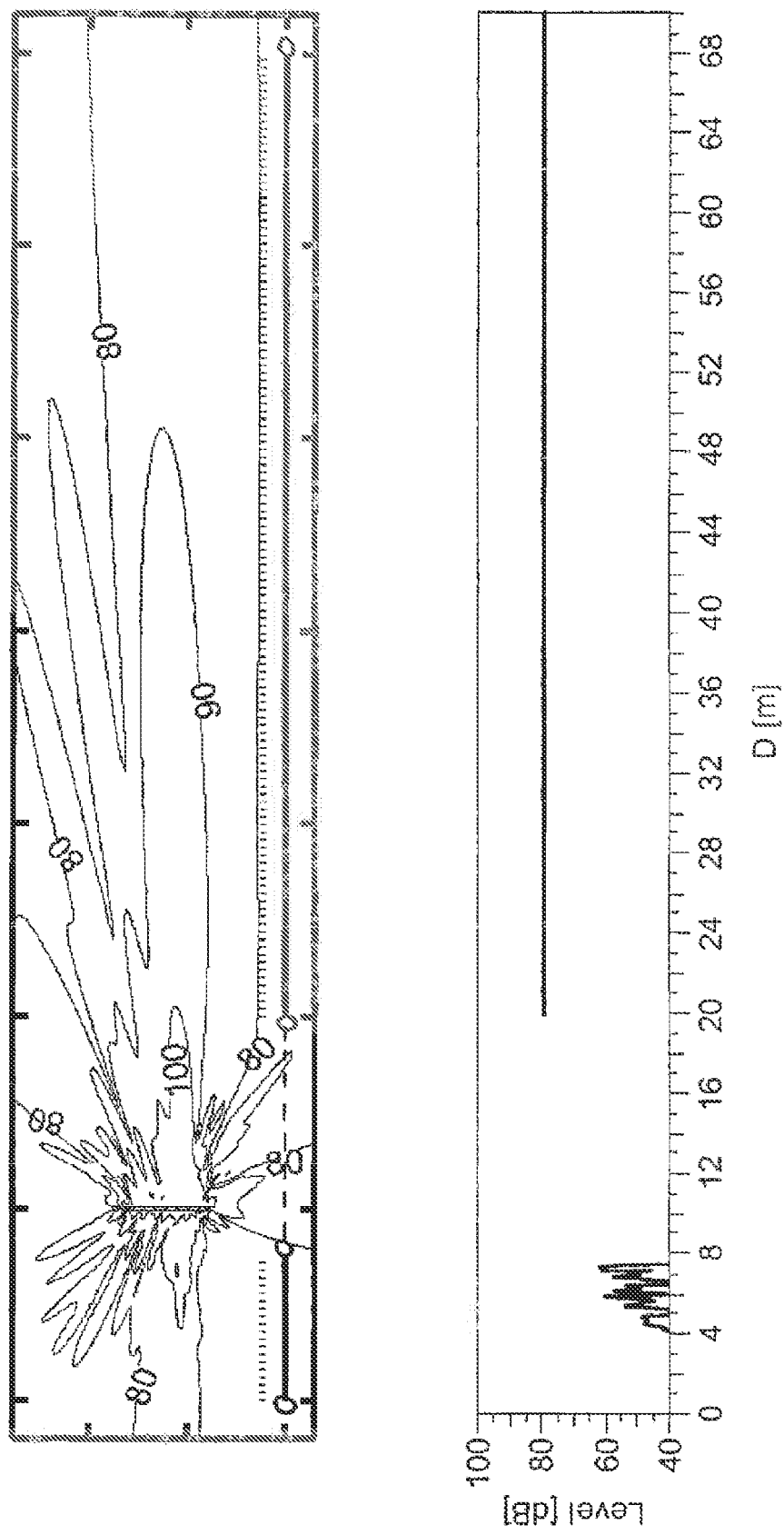
Figure 11:
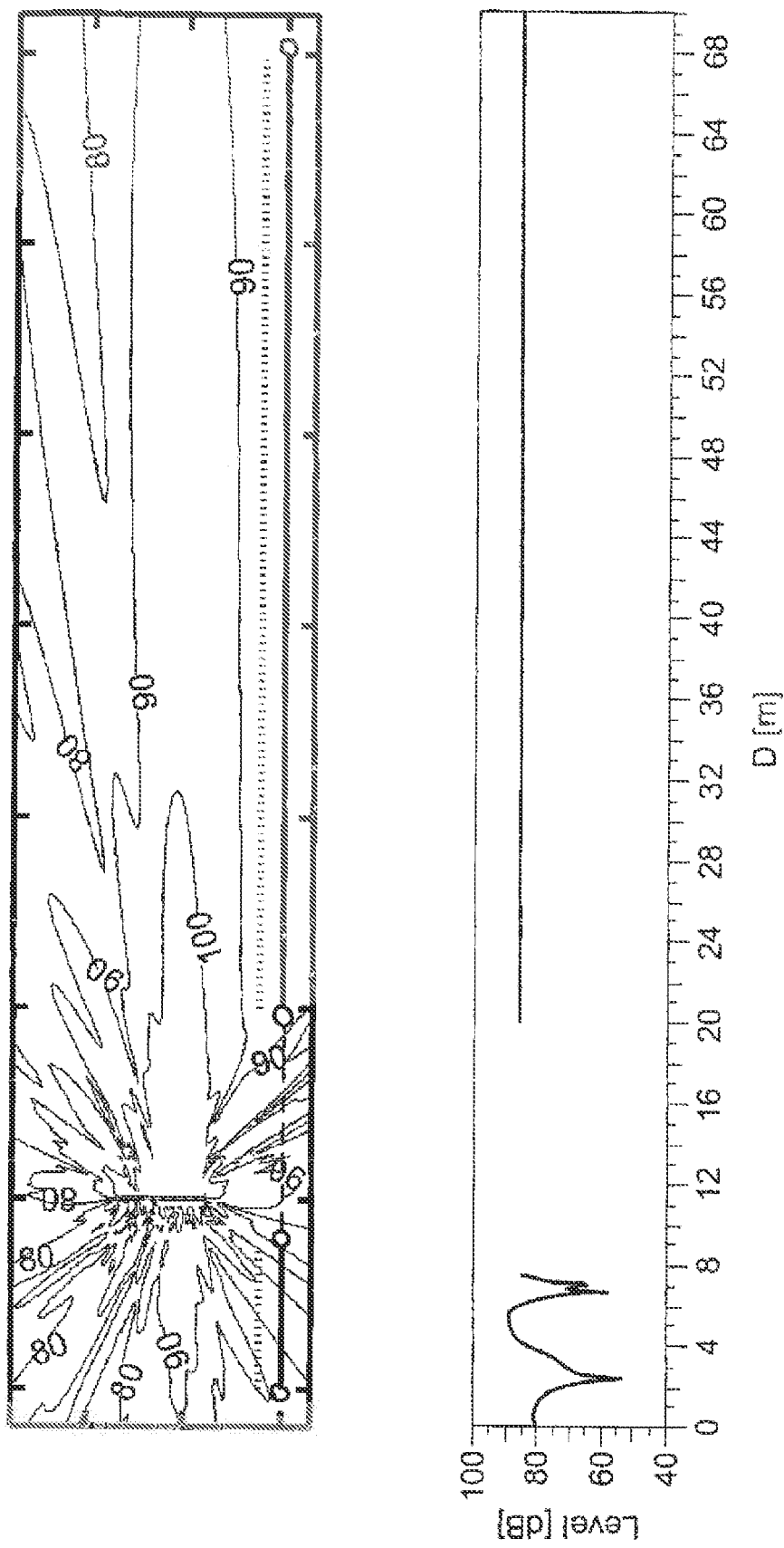
Figure 12:
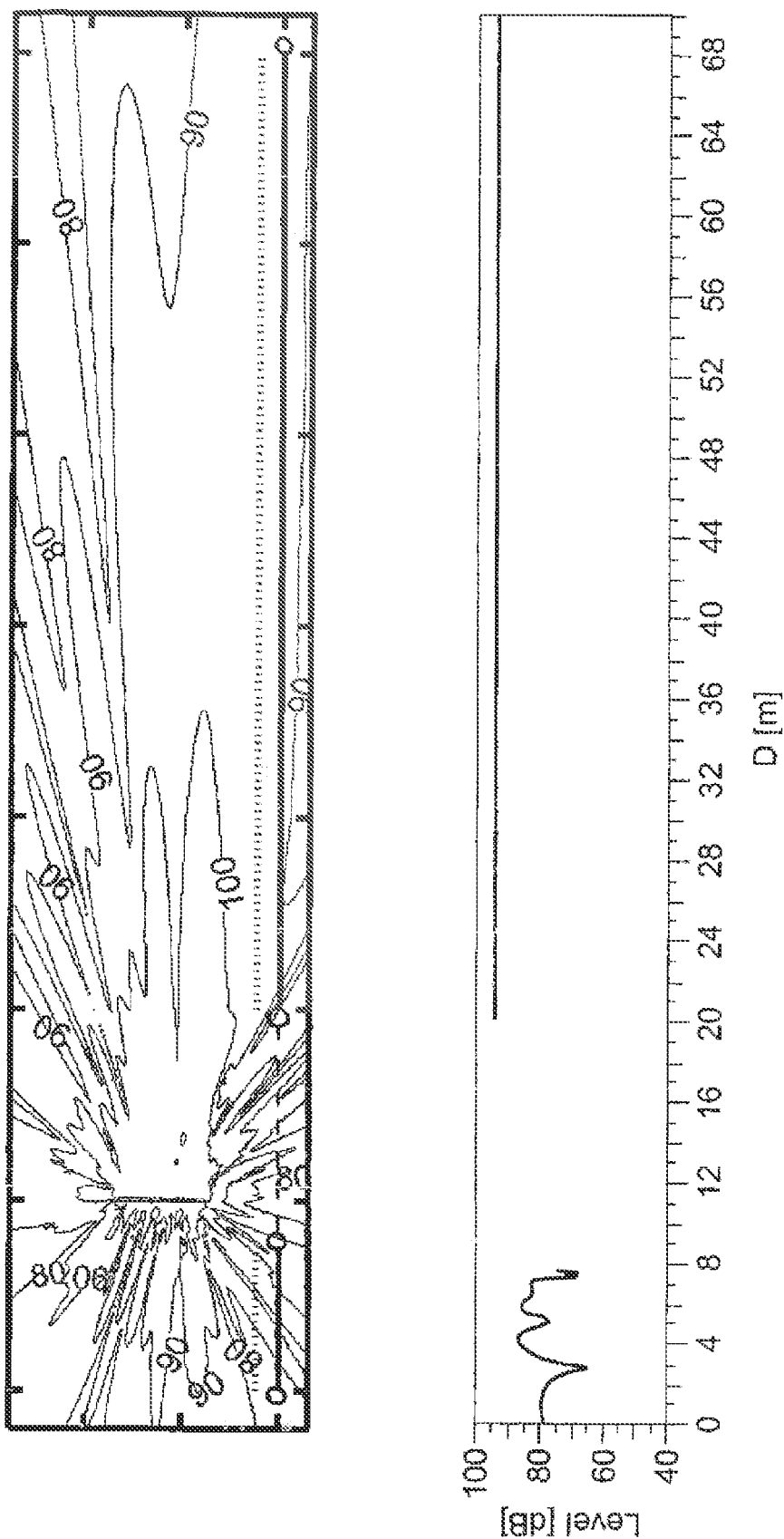
Figure 13:
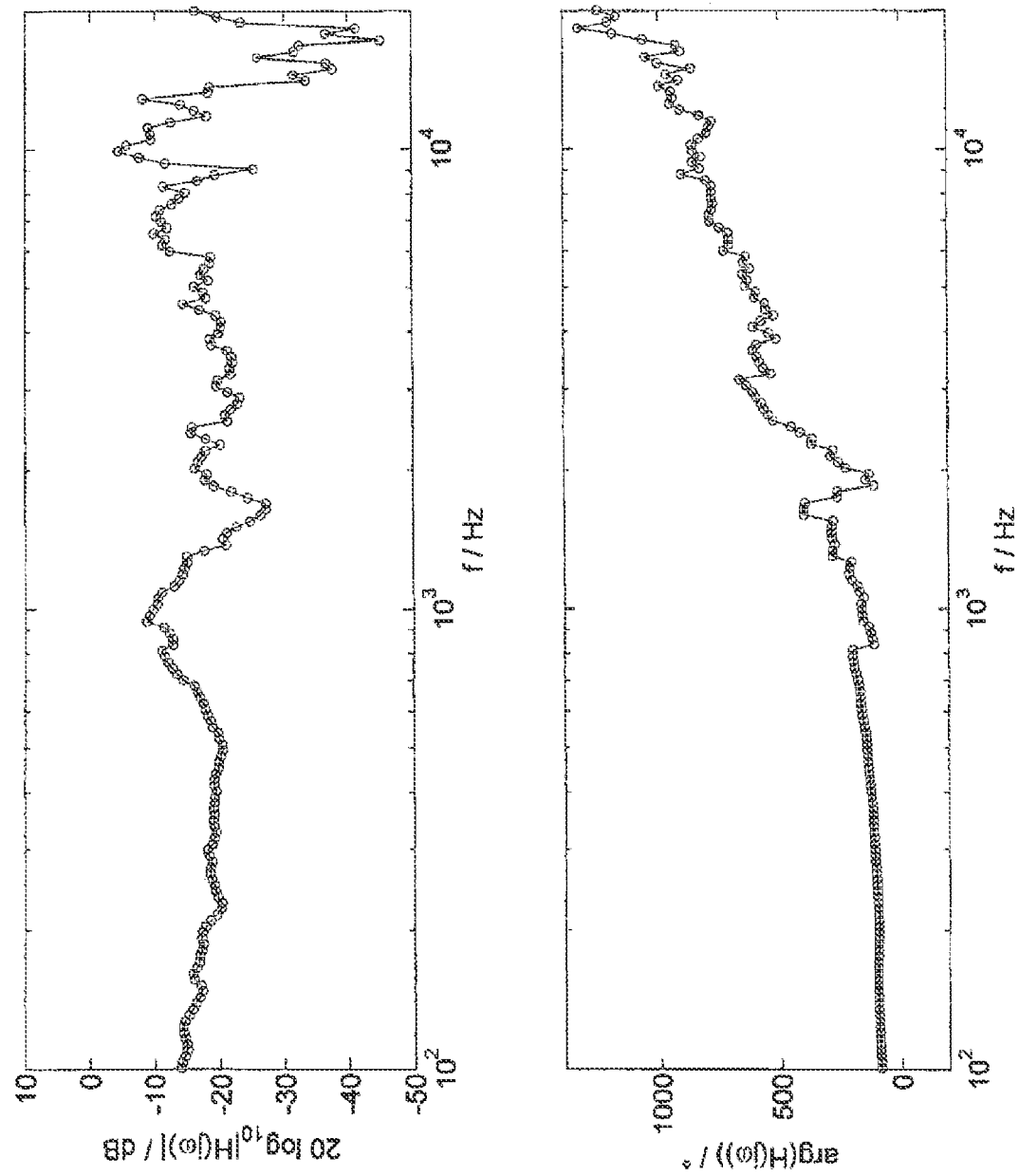

Further embodiments will now be described in detail with reference to the figures of a drawing, in which FIG. 1 shows a schematic diagram of a loudspeaker arrangement, FIG. 2 shows a schematic diagram of an arrangement with a loudspeaker and a space to be covered, FIG. 3 shows a side view of a spatial sound level distribution for a simulated sound field, for a frequency of 1000 Hz, and a sound level distribution in a prohibited area of linear shape (left graph) as well as in a listening area of linear shape (right graph) for the non-optimised case, FIG. 4 shows diagrams for a simulated sound field similar to FIG. 3 with a maximised mean sound power, wherein the mean electric power fed into the loudspeaker system was kept constant, FIG. 5 shows diagrams for a simulated sound field similar to FIG. 3 with the most uniform sound level distribution possible in a listening area (optimised according to the smoothness criterion), FIG. 6 shows diagrams for a simulated sound field similar to FIG. 3 with a minimised mean sound power in a prohibited area, FIG. 7 shows a schematic view of a flow diagram for a process for determining a configuration of a loudspeaker arrangement, FIG. 8 shows diagrams for a simulated sound field similar to FIG. 3, wherein a normalised sound power criterion and the smoothness criterion were optimised simultaneously and using the same weight, FIG. 9 shows diagrams for a simulated sound field similar to FIG. 3 for the case of an optimisation of the objective function, where the power criterion has a stronger (hundred-fold) weight, FIG. 10 shows diagrams for a simulated sound field similar to FIG. 3, wherein the smoothness criterion and avoidance of radiation into a prohibited area were optimised simultaneously and with the same weight, FIG. 11 shows diagrams for a simulated sound field similar to FIG. 3, wherein the smoothness criterion and the uniformity of the filter amplitudes were optimised simultaneously, FIG. 12 shows diagrams for a simulated sound field similar to FIG. 3, wherein the normalised sound power criterion, the smoothness criterion and the uniformity of the filter amplitude were simultaneously optimised, FIG. 13 shows a graphic depiction of the amplitude response (top) and the phase response (bottom) of a filter transfer function as the result of an optimisation, and FIG. 14 shows diagrams comparable to FIG. 13, but additionally using a function part $F_5$ during optimisation.

A sound system may be based on different configuration variants, such as different loudspeaker models, positions, angles, filter settings etc. Such variables are called configuration parameters. As mentioned in the beginning, evaluation of a sound system concept in practice is effected utilising the audible (acoustic) properties of the loudspeaker system, i.e. the sound field at the receive locations and in the surroundings of the system. Therefore provision is regularly made for the objective function to be defined based on the sound field, i.e. as a measure for the extent to which the calculated acoustic properties deviate from the predefined requirements.

In order to describe the sound field, the area concerned is covered sufficiently densely in a representative manner with receive locations, so that for each receive location $i=1, \ldots, N_H$ there exists a total transfer function $H_i(f, p_1, \ldots, p_N)$ of the sound system for transmission to the respective receive location, which is dependent on the frequency $f$ and the configuration parameters $p_1, \ldots, p_N$ (given suitable normalisation). Evaluation of the sound radiation properties is then effected by means of the sound powers $$P_i(f, p_1, \ldots, p_N) = |H_i(f, p_1, \ldots, p_N)|^2$$

and the sound levels measured in dB $$L_i(f, p_1, \ldots, p_N) = 10 \log_{10} P_i(f, p_1, \ldots, p_N)$$

at the receive locations $i=1, \ldots, N_H$.

An important evaluation criterion is the reciprocal mean sound power in the listening area, given by the function $$P^{-1}(f, p_1, \ldots, p_N) = \left[\frac{1}{N_H}\sum_{i=1}^{N_H} P_i(f, p_1, \ldots, p_N)\right]^{-1},$$

which requires to be minimised by varying the configuration parameters $p_1, \ldots, p_N$, in order to achieve maximum sound power in the listening area.

A further evaluation criterion is the "smoothness criterion" S, which describes the variation of the spatial sound level distribution from the mean value or from a required distribution:

$$S(f, p_1, \ldots, p_N) = \frac{1}{N_H}\sum_{i=1}^{N_H}\left(\frac{L_i(f, p_1, \ldots, p_N) - }{\overline{L}(f, p_1, \ldots, p_N) - L_{t,i}(f)}\right)^2.$$

$\overline{L}(f, p_1, \ldots, p_N)$ is understood to describe the sound level averaged across all receive locations, while $L_{t,i}(f)$ describes a required deviation of the sound level at the i-th receive location from the mean value, in accordance with a predefined spatial required distribution.

Another evaluation criterion relates to areas, in which the radiation of sound is to be avoided (prohibited areas), in order, for example, to reduce harmful reflections or sound emissions out of the building or to keep disturbances of the monitor sound in the stage area at a minimum. To formulate such a criterion, this "prohibited zone" is covered with receive locations in an analogous manner to covering the listening area with receive locations, thereby obtaining, for each receive location $i=1, \ldots, N_V$ a total transfer function $\tilde{H}_i(f, p_1, \ldots, p_N)$ of the sound radiation system for transmission to the respective receive location. Analogously sound powers $\tilde{P}(f, p_1, \ldots, p_N) = |\tilde{H}_i(f, p_1, \ldots, p_N)|^2$ are defined, and the mean sound power in the prohibited area expressed by $$\bar{P}(f, p_1, \ldots, p_N) = \frac{1}{N_V} \sum_{i=1}^{N_V} \tilde{P}_i(f, p_1, \ldots, p_N),$$

is to be minimised.

These components (parts) can be utilised singly or combined in various ways to form an objective function, for example as a sum or a logical link.

In order to illustrate this situation and the subsequent statements, a loudspeaker system with acoustic results is shown by way of example in FIG. 1. Shown is a vertical arrangement of eight horizontally aligned loudspeaker boxes. The system measures approx. 4 m in length and is situated 4 m above the floor. The receive area to be covered, which for example may be part of an event venue (acoustic space), extends in front of the system (right) from 10 m to approx. 60 m, with an ear height of 1.2 m above the floor. A stage area, which is not to be covered, is behind the system (left) and is approx. 2 m to 10 m. Each of the loudspeaker boxes has eight sound transducers, which are individually controlled by means of filter transfer functions. In this case therefore the complex-valued amplitudes of the filter frequency responses represent the configuration parameters.

FIG. 3 shows the non-optimised standard configuration of the example. The upper part of FIG. 3 shows, exactly as in all further such illustrations, the spatial sound level distribution, in side view, for a frequency of 1000 Hz, whilst the lower part of FIG. 3 shows the sound level distribution in the linearly shaped prohibited area (left graph) and in the also linearly shaped listening area (right graph). The prohibited area and the listening area are shown by dashed lines in the upper part of the figure. It can be clearly recognised that a large part of the sound power is emitted above and beyond the listening area, in other words, misses it. The sound level distribution in the listening area is dominated by interference patterns and the sound level in the prohibited area is at a similarly high level as in the listening area.

FIG. 4 shows a configuration variant of the example in FIG. 2 with a maximised mean sound power, wherein the mean electric power fed to the sound transducers was kept constant, so that the mean square amplification of the filters of the control unit remains the same. The radiation directed at the listening area is distinctly recognisable. The sound level distribution in the listening area is smooth, but not uniform. The sound level in the prohibited area is distinctly less than in the listening area due to the optimised directional effect.

FIG. 5 shows a configuration variant of the example in FIG. 2 with a most uniform sound level distribution in the listening area (optimised according to the smoothness criterion). The sound level in the listening area is almost perfectly evenly distributed. In the prohibited area the level is at a similar magnitude as in in the listening area. As in the non-optimised case a large part of the power is emitted above and beyond the listening area.

FIG. 6 finally shows a configuration variant of the example where the sound power in the prohibited area is at a minimum. In fact it can be recognised that the prohibited area is omitted to a large extent, albeit not completely. The reduction in sound level in the prohibited area compared to the listening area is considerable.

Exemplary embodiments will now be described, where the objective function encompasses one or more sound-field-independent function terms. Parts of the objective function may be the configuration parameters of the loudspeaker arrangement themselves and/or function terms dependent on one or more of the configuration parameters, for example, position and orientation of the loudspeakers or the filter settings for the loudspeakers.

FIG. 7 shows a schematic view of a flow diagram for a computer-based process for determining a configuration of a loudspeaker arrangement. Determining the configuration may be executed using a software application on a computer. With the method for automated determination of the configuration for the loudspeaker arrangement encompassing several loudspeaker elements, which is to be used for radiating sound into a concrete space, an initial configuration with initial configuration parameters is provided in step 70. These may, for example, be transferred to the computer used for optimisation in an electronic form via an interface. Alternatively or additionally provision may be made for initial configuration parameters, which for this or other embodiments may be derived wholly or partially from experimentally measured data, to be recorded by the user via a user interface of the computer, for example by means of keyboard input. Thus in step 71, a (first) candidate configuration exists in the computer, which is used in step 72 for an acoustic simulation. This is done, in steps 73 and 74, taking into account properties of the space to be covered such as an event location or an event venue and properties of the loudspeakers used (sound sources). This is done using a radiation model for the arrangement consisting of loudspeakers and space. Such a radiation model uses measured and/or calculated data, which in particular characterise the sound radiation of a loudspeaker as well as its electric control, position and/or orientation in the space. Additionally the space itself may be defined by its boundaries and/or the acoustic wall materials used. The result consists in the time- and frequency-dependent sound pressure distribution in the overall space, including also defined receive locations. Defining a radiation model for a given loudspeaker arrangement for a space to be covered is known as such in various forms and therefore does not require any further explanation.

Based on the acoustic simulation, the sound field for the current candidate configuration is determined in step 75. Then in step 76 a value for the previously defined objective function is determined for the concrete sound field and for the given configuration parameters. The objective function used, apart from one or more sound-field-dependent function terms, also takes into account at least one sound-field-independent, non-acoustic function term.

The optimisation module 77 stores the calculated value of the objective function as well as the associated values of the configuration parameters. In step 78 a check is carried out, as to whether the current candidate configuration corresponds to a local minimum of the objective function within a predefined tolerance. If this is not the case a new candidate configuration is determined by means of the optimisation algorithm on the basis of the current candidate configuration, optionally taking into account one or more previously determined candidate configurations. If, however, a local minimum was found, electronic information regarding the selected configuration is generated by means of the configuration parameters and provided for output on the computer (step 79) and this can be displayed on the display of the computer. Provision may also be made to alternatively or additionally generate and output control signals based on the selected configuration, which are then passed by the computer to a control facility of the loudspeaker arrangement via an electronic interface.

The described method can be automatically executed on a computer or a computer system with the aid of a software application.

Aspects regarding the inclusion of sound-field-independent function terms in the objective function will now be described below.

To begin with, the aspect "decoupling from the overall volume" will be explained.

The objective function can be supplemented by function terms which allow decoupling of the component $P^{-1}$ from the overall volume. It may seem desirable, to form an objective function as the sum of $P^{-1}$ and S, but it is immediately obvious, that the summand $P^{-1}$ shows a different behaviour from the summand S for a changed overall volume, i.e. for a changed mean filter amplitude, for the former increases quadratically with the reciprocal overall volume, whilst the latter remains unchanged. However the result of optimisation shall not be dependent on the overall volume, wherefore it is necessary for all summands of the objective function to be independent of the overall volume. The function part $P^{-1}$ may be decoupled from the overall volume in that it is set in relation to the amplitudes of the filter transfer functions. To this end one could consider, for example, the averaged squared filter amplitude, $$G(f, p_1, \ldots, p_N) = \frac{1}{N_F} \sum_{i=1}^{N_F} |h_i(f, p_1, \ldots, p_N)|^2,$$

wherein $h_i(f, p_1, \ldots, p_N)$ describes the transfer function of the i-th filter for $i=1, \ldots, N_F$, respectively. Therefore $G(f, p_1, \ldots, p_N)$ is a sound-field-independent function term. In this way an objective function, which represents a sum composed of a sound power criterion and a smoothness criterion and the summands of which are independent of the overall volume, can be formulated as follows:

$$F_1(f, p_1, \ldots, p_N) = c_1 F_1(f, p_1, \ldots, p_N) + c_2 F_2(f, p_1, \ldots, p_N)$$

with $$F_1(f, p_1, \ldots, p_N) = \frac{G(f, p_1, \ldots, p_N)}{P(f, p_1, \ldots, p_N)}$$

and $$F_2(f, p_1, \ldots, p_N) = S(f, p_1, \ldots, p_N)$$

as well as factors $c_1$ and $c_2$ for weighting the individual criteria.

FIG. 8 shows a configuration variant for the example according to FIG. 2, where the above objective function has been optimised with $c_1=1$ and $c_2=1$. As can be recognised, radiation is clearly directed at the listening area for a simultaneously very uniform sound level distribution in the listening area.

FIG. 9 for the chosen example illustrates the case of an optimisation of the objective function with $c_1=100$ and $c_2=1$. Weighting of the power criterion is therefore stronger. The shift in the weighting of the criteria is reflected in the optimisation result: The directional effect of the emission is distinctly improved compared to the previous case, but recognisably so at the cost of uniformity in the sound level distribution.

Next, the aspect "decoupling of the prohibited zones from the overall volume" shall be explained.

In a favourable design based thereon even prohibited zones can now be better incorporated in the objective function. Analogously to the normalised sound power criterion a further normalised summand may be added to the objective function, which, when minimised, causes a reduction of the sound radiation into the prohibited zones to be reduced:

$$F_3(f, p_1, \ldots, p_N) = \frac{\check{P}(f, p_1, \ldots, p_N)}{G(f, p_1, \ldots, p_N)}.$$

The result is the following extended objective function:

$$F(f, p_1, \ldots, p_N) = c_1 F_1(f, p_1, \ldots, p_N) + c_2 F_2(f, p_1, \ldots, p_N) + c_3 F_3(f, p_1, \ldots, p_N)$$

with weighting factors $c_1$, $c_2$ and $c_3$.

FIG. 10 shows the result of optimising this function for $c_1=0$, $c_2=1$ and $c_3=1$ for the example. It can be recognised that the sound level distribution in the listening area is very uniform and that the sound level in the prohibited area is much reduced.

Next the aspect "uniformity of filter amplitudes" will be explained.

Consideration may be given to introducing a function part which compares the proportions of the filter amplitudes relative to each other. If a maximum uniform filter amplitude for all transmission paths (loudspeakers or loudspeaker channels) is required in the objective function, higher overall sound levels can be achieved for approximately the same quality.

$$F_4(f, p_1, \ldots, p_N) = \frac{\max_i |h_i(f, p_1, \ldots, p_N)|^2}{G(f, p_1, \ldots, p_N)}.$$

Here too, because of normalisation by the sound-field-independent function term $G(f, p_1, \ldots, p_N)$, independence from the overall volume is achieved. In practical implementations it may be necessary to approximate the maximum function max( ), which need not be necessarily continuously differentiable with respect to the configuration parameters everywhere in the configuration parameter space, by a continuously differentiable function, since continuous differentiability of the objective function is a prerequisite for many optimisation algorithms. The objective function may then again be extended as follows:

$$F(f, p_1, \ldots, p_N) = c_1 F_1(f, p_1, \ldots, p_N) + c_2 F_2(f, p_1, \ldots, p_N) + c_3 F_3(f, p_1, \ldots, p_N) + c_4 F_4(f, p_1, \ldots, p_N)$$

with weighting factors $c_1$, $c_2$, $c_3$ and $c_4$.

The result of optimising this function with $c_1=0$, $c_2=1$, $c_3=0$ and $c_4=0.01$, i.e. taking into account the smoothness criterion and the uniformity criterion of the filter amplitudes, is shown for the example in FIG. 11. The sound level response in the listening area is again very uniform. Additionally, the overall sound level in the listening area is higher by approx. 5 dB than in the case shown in FIG. 5, which differs from the one shown here only by $c_4=0$.

In the example discussed here the overall sound level may be further increased by almost 10 dB, if the normalised sound power criterion is added. If the above objective function is optimised with $c_1=1$, $c_2=1$, $c_3=0$ and $c_4=0.01$, the result shown in FIG. 12 is obtained. The sound level is raised compared to the previous case without any remarkable losses regarding uniformity of the sound level in the listening area. In this case too, the high magnitude of the overall sound level is due, to a significant extent, to the uniformity criterion of the filter amplitudes. Compared to the case shown in FIG. 8, which is different from the one shown here only by $c_4=0$, the overall sound level is raised by more than 5 dB, without remarkable losses regarding the other criteria.

The examples discussed so far show that simultaneous optimisation of the different criteria is not difficult. In addition it is possible to fine-tune the compromise found during optimisation between the different requirements by changing the associated weighting factors, possibly frequency-dependently.

Next the aspect "uniformity of the filter frequency response" will be explained.

The frequency response of the filter functions can be taken into account in the objective function. The amplitude and phase of the filter function over the frequency should not vary too much when carrying out numerical calculations and signal-processing. A sound-field-independent function part can then be introduced into the objective function, which evaluates the jump of the filter frequency responses from one frequency $f_{i-1}$ to the next frequency $f_i$, again suitably normalised for independence from the overall volume:

$$F_5(f_i, p_1, \ldots, p_N) = \frac{\sum_{j=1}^{N_F} |h_j(f_i, p_1, \ldots, p_N) - h_j(f_{i-1})|^{2n}}{G^n(f_i, p_1, \ldots, p_N)}$$

with an integer exponent $n \geq 1$.

FIG. 13 shows an exemplary response of a filter transfer function, which is the result of an optimisation, in which the function part $F_5$ is not present in the objective function. For comparison the transfer function of the same filter channel is shown in FIG. 14 as the result of an optimisation using the function part $F_5$ with the objective function remaining the same in other respects. The latter transfer function shows a distinctly less jumpy behaviour than the former one.

Next the aspect "position and/or angling" will be explained.

Provision may be made for including other configuration parameters in the objective function, for example position or angling of the loudspeakers. It may be mechanically of advantage, if a certain position and direction is chosen. This can be contrasted with quality criteria using a weighting. For example, for a loudspeaker system composed of several loudspeaker boxes a function part $$F_6(f, p_1, \ldots, p_N) = \sum_{i=1}^{N_L-1} a_i^2(p_1, \ldots, p_N)$$

may be defined, wherein $\alpha_i(p_1, \ldots, p_N)$ specifies the angle between the i-th and the i+1-th box for all $i=1, \ldots, N_L-1$.

The features of the invention disclosed in the description, the claims and the drawing may be important, both singly and in any given combination, to realising the various embodiments of the invention.

The invention claimed is:

1. A method for determining a configuration for a loudspeaker arrangement for radiating sound into a space, wherein the method comprises the following steps:
   providing an initial configuration with initial configuration parameters for a loudspeaker arrangement for radiating sound into a space, in a computer,
   determining configurations with respectively associated configuration parameters based on an objective-function-based optimising procedure, wherein iteratively, in a computer, starting with the initial configuration,
      a sound field for the respective space and/or parts thereof is determined for a candidate configuration by means of simulation,
      a value of an objective function associated with the candidate configuration and the simulated sound field is determined, and
      a new candidate configuration is chosen for the loudspeaker arrangement, and selecting a configuration with configuration parameters from the iteratively determined candidate configurations in dependence of at least one selection criterion which takes into account at least the values determined for the objective function,
   wherein an objective function is used in the optimising procedure, which apart from one or more sound-field-dependent function terms comprises a sound-field-independent function term, which is dependent on at least one part of the configuration parameters but not on the simulated sound field, wherein the sound-field-independent function term and/or another sound-field-independent function term are dependent on an average smoothness of frequency responses of all filters in a control facility for controlling the loudspeaker arrangement, wherein the average smoothness is determined by a weighted combination of the frequency responses of all filters.

2. The method according to claim 1, wherein the sound-field-independent function term and/or another sound-field-independent function term are dependent on at least one filter parameter for a filter in a control facility for controlling the loudspeaker arrangement.

3. The method according to claim 1, wherein the sound-field-independent function term and/or the other sound-field-independent function term are dependent on a spatial position of one or more loudspeaker elements of the loudspeaker arrangement.

4. The method according to claim 1, wherein the sound-field-independent function term and/or the other soundfield-independent function term are dependent on a spatial orientation of one or more loudspeaker elements of the loudspeaker arrangement.

5. The method according to claim 1, wherein the objective function comprises several function parts, wherein at least one of the several function parts is dependent only on the sound-field-independent function term and/or the other sound-field-independent function term.

6. The method according to claim 1, wherein the objective function comprises a function part, with which, for a given candidate configuration for the loudspeaker arrangement, a deviation of a sound level from a required value in a partial area of the space is evaluated.

7. The method according to claim 1, wherein the objective function comprises a function part, with which, for a given candidate configuration for the loudspeaker arrangement and independently of an overall volume, a magnitude of a sound level in a partial area of the space is evaluated.

8. The method according to claim 1, wherein the objective function comprises a function part, with which, for a given candidate configuration for the loudspeaker arrangement and independently of an overall volume, a minimisation of sound radiation in a partial area is evaluated.

9. The method according to claim 1, wherein the objective function comprises a function part, with which uniformity of an electric load distribution on at least a part of one or more loudspeaker elements of the loudspeaker arrangement is evaluated and which is dependent on only one or more sound-field-independent function terms.

10. The method according to claim 1, wherein in the computer, based on with the selected configuration, control data are generated for the control facility for controlling the loudspeaker arrangement and made available at an interface.

11. A non-transitory computer-readable medium storing computer-executable instructions which when executed by one or more processors result in performing operations comprising:
provide an initial configuration with initial configuration parameters for a loudspeaker arrangement for radiating sound into a space, in a computer,
determine configurations with respectively associated configuration parameters based on an objective-function-based optimizing procedure, wherein iteratively, in the computer, starting with the initial configuration,
a sound field for the respective space and/or parts thereof is determined for a candidate configuration by means of simulation,
a value of an objective function associated with the candidate configuration and the simulated sound field is determined, and
a new candidate configuration is chosen for the loudspeaker arrangement, and selecting a configuration with configuration parameters from the iteratively determined candidate configurations in dependence of at least one selection criterion which takes into account at least the values determined for the objective function,
wherein an objective function is used in the optimising procedure, which apart from one or more sound-field-dependent function terms comprises a sound-field-independent function term, which is dependent on at least one part of the configuration parameters but not on the simulated sound field, wherein the sound-field-independent function term and/or another sound-field-independent function term are dependent on an average smoothness of frequency responses of all filters in a control facility for controlling the loudspeaker arrangement, wherein the average smoothness is determined by a weighted combination of the frequency responses of all filters.

12. The medium according to claim 11, wherein the sound-field-independent function term and/or another sound-field-independent function term are dependent on at least one filter parameter for a filter in a control facility for controlling the loudspeaker arrangement.

13. The medium according to claim 11, wherein the sound-field-independent function term and/or the other sound-field-independent function term are dependent on a spatial position of one or more loudspeaker elements of the loudspeaker arrangement.

14. The medium according to claim 11, wherein the sound-field-independent function term and/or the other sound-field-independent function term are dependent on a spatial orientation of one or more loudspeaker elements of the loudspeaker arrangement.

15. The medium according to claim 11, wherein the objective function comprises several function parts, wherein at least one of the several function parts is dependent only on the sound-field-independent function term and/or the other sound-field-independent function term.

16. The medium according to claim 11, wherein the objective function comprises a function part, with which, for a given candidate configuration for the loudspeaker arrangement, a deviation of a sound level from a required value in a partial area of the space is evaluated.

17. The medium according to claim 11, wherein the objective function comprises a function part, with which, for a given candidate configuration for the loudspeaker arrangement and independently of an overall volume, a magnitude of a sound level in a partial area of the space is evaluated.

18. The medium according to claim 11, wherein the objective function comprises a function part, with which, for a given candidate configuration for the loudspeaker arrangement and independently of an overall volume, a minimization of sound radiation in a partial area is evaluated.

* * * * *